US006542370B1

(12) United States Patent
Wang et al.

(10) Patent No.: US 6,542,370 B1
(45) Date of Patent: Apr. 1, 2003

(54) HEAT DISSIPATING DEVICE FOR A CPU

(75) Inventors: Jack Wang, 2, Ta-Chih Rd., Taoyuan City, Taoyuan Hsien (TW); Cheng-Hua Cheng, Taoyuan (TW); Michael Lin, Taoyuan (TW); Charles Ma, Taoyuan (TW)

(73) Assignees: Waffer Technology Corporation, Taoyuan Hsien (TW); Jack Wang, Taoyuan Hsien (TW)

(*) Notice: Subject to any disclaimer, the term of this patent is extended or adjusted under 35 U.S.C. 154(b) by 0 days.

(21) Appl. No.: 10/136,356

(22) Filed: May 2, 2002

(51) Int. Cl.[7] .................................................. H05K 7/20

(52) U.S. Cl. ....................... 361/704; 361/690; 361/695; 174/16.3; 165/80.3; 165/185; 257/721; 257/706

(58) Field of Search ................................ 361/689–695, 361/700–704, 705, 707, 709, 719; 257/706, 712, 721; 165/80.2, 80.3, 122, 104.33, 185; 174/16.3, 252

(56) References Cited

U.S. PATENT DOCUMENTS 4,985,805 A * 1/1991 Riedel et al. ............... 361/704
5,077,637 A * 12/1991 Martorana et al. .......... 361/717
5,316,080 A * 5/1994 Banks et al. ................ 165/185
5,390,734 A * 2/1995 Voorhes et al. ............. 165/185
5,566,752 A * 10/1996 Arnold et al. ............. 165/185
5,898,569 A * 4/1999 Bhatia ........................ 361/700
6,052,280 A * 4/2000 Dilley et al. ................ 361/687
6,060,166 A * 5/2000 Hoover et al. .............. 428/408
6,286,591 B1 * 9/2001 Bonneville .................. 165/185
6,407,922 B1 * 6/2002 Eckblad et al. ............. 361/704

* cited by examiner

*Primary Examiner*—Boris Chervinsky
(74) *Attorney, Agent, or Firm*—Fei-Fei Chao; Venable, Baetjer, Howard & Civiletti, LLP

(57) ABSTRACT

A heat dissipating device has a conductor holder and a heat conductor. The conductor holder is securely attached to the CPU base and has a through hole. The heat conductor is securely connected to the through hole in the conductor holder and contacts with the CPU. The heat conductor comprises multiple heat conductive elements made of a material with good heat conductivity. One end of the heat conductive elements are twisted together to form a bound section on the first end of the heat conductor. The other end of each heat conductive element is far away from the other element so as to form an expansion section on a second end of the heat conductor. In such an arrangement, the heat generated by the CPU can be efficiently dissipated from the expansion section of the heat conductor.

8 Claims, 8 Drawing Sheets

HEAT DISSIPATING DEVICE FOR A CPU

BACKGROUND OF THE INVENTION

1. Field of the Invention

The present invention relates to a heat dissipating device, and more particularly to a heat dissipating device for a CPU and having an efficient heat-dissipating effect.

2. Description of Related Art

Due to the increase of the processing speed of the CPU, heat generated by the central processing unit (CPU) increases. To prevent unreliability and damage to the computer heat generated by the CPU must be dissipated quickly. With reference to FIG. 7, a conventional heat dissipating device for a computer, a CPU (54) in accordance with the prior art comprises a dissipating base (50). The dissipating base (50) is securely attached to a CPU base (52) with a fastener (56), wherein the CPU (54) is secured in the CPU base (52). Multiple fins (500) are mounted on the top of the dissipating base (50), and a fan (not shown) is secured to the top of the fins (500).

However, the heat-dissipating effect of the conventional heat dissipating device is not enough for the new CPU with a high speed of over Giga-Hertz. With reference to FIG. 8, another conventional heat dissipating device (60) in accordance with the prior art comprises a contacting case (61), two conductive tubes (62) and a dissipating base (63). The contacting case (61) is attached to the CPU and has a liquid heat transmitting medium contained in the case (61). The conductive tubes (62) are connected to the contacting case (61) and communicate with the case (61). The dissipating base (63) is connected to the conductive tubes (62) and communicates with the tubes (62). Multiple fins (64) are integrally formed on the top of the dissipating base (63), and a fan (not shown) is mounted above the fins (64). Accordingly, the heat generated by the CPU will be conducted to the dissipating base (63) with the medium in the conductive tubes (62) and be dissipated from the base (63).

However, because a specific liquid medium is needed to carry the heat from the contacting case (61) through conductive tubes (62) to the dissipating base (63), the cost of the conventional heat dissipating device (60) is expensive.

To overcome the shortcomings, the present invention tends to provide a heat dissipating device to mitigate or obviate the aforementioned problems.

SUMMARY OF THE INVENTION

The main objective of the invention is to provide a heat dissipating device for a CPU and that has an excellent and efficient heat-dissipating effect. The heat dissipating device has a conductor holder and a heat conductor. The conductor holder is securely attached to the CPU base in which the CPU is mounted and has a through hole defined in the conductor holder. The heat conductor is securely connected to the through hole in the conductor holder and contacts with the CPU. The heat conductor comprises multiple heat conductive elements made of a material with good heat conductivity. One end of the heat conductive elements are combined together to form a bound section on the first end of the heat conductor. The other end of each heat conductive element is far away from the other element so as to form an expansion section on a second end of the heat conductor. In such an arrangement, the heat generated by the CPU can be efficiently dissipated from the expansion section of the heat conductor. In addition, the structure of the heat dissipating device can be simplified, and the cost for manufacturing the heat dissipating device is also reduced.

Other objects, advantages and novel features of the invention will become more apparent from the following detailed description when taken in conjunction with the accompanying drawings.

DETAILED DESCRIPTION OF PREFERRED EMBODIMENT

Figure 1:
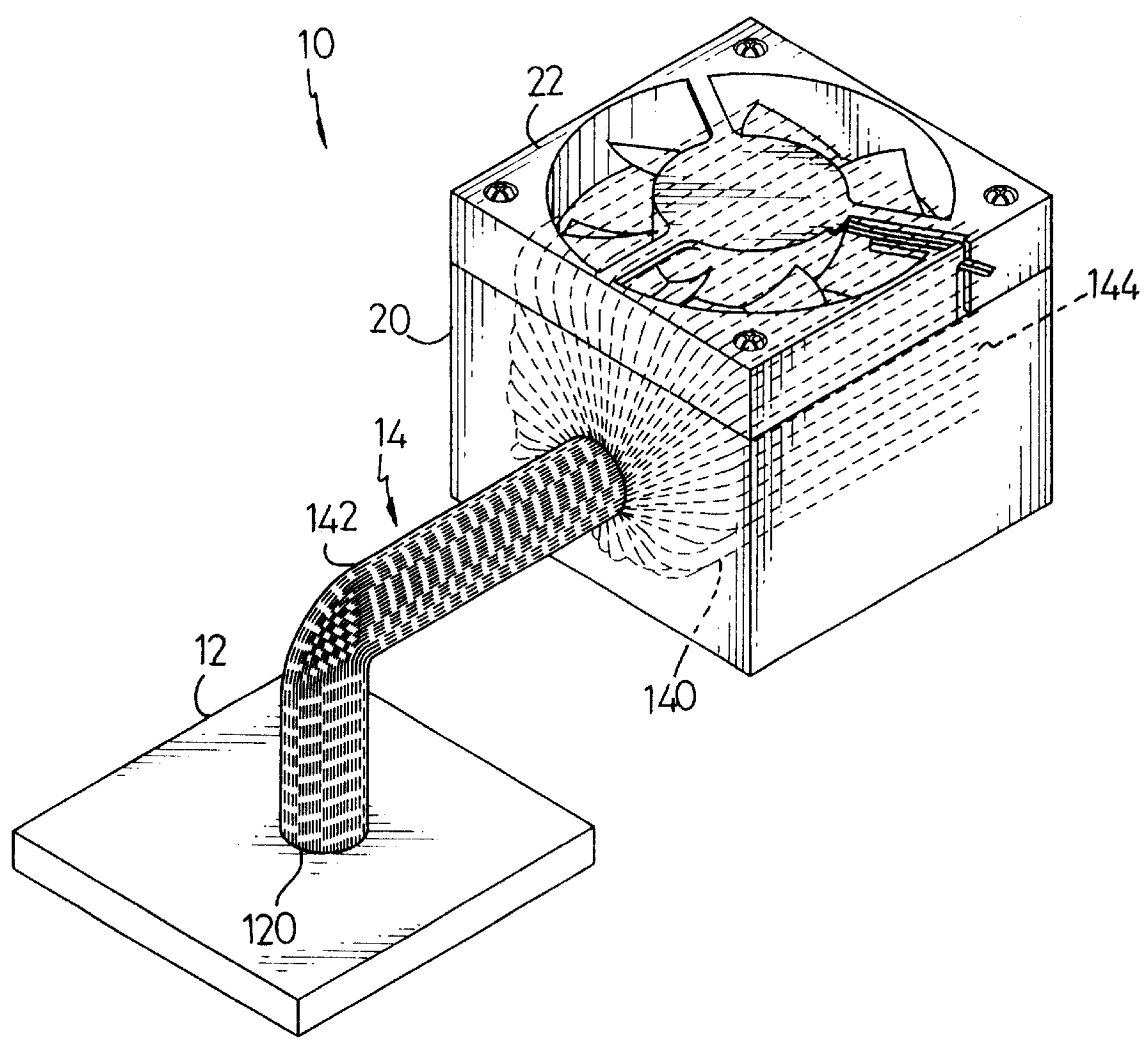
FIG. 1 is a perspective view of a heat dissipating device in accordance with the present invention.
Figure 2:
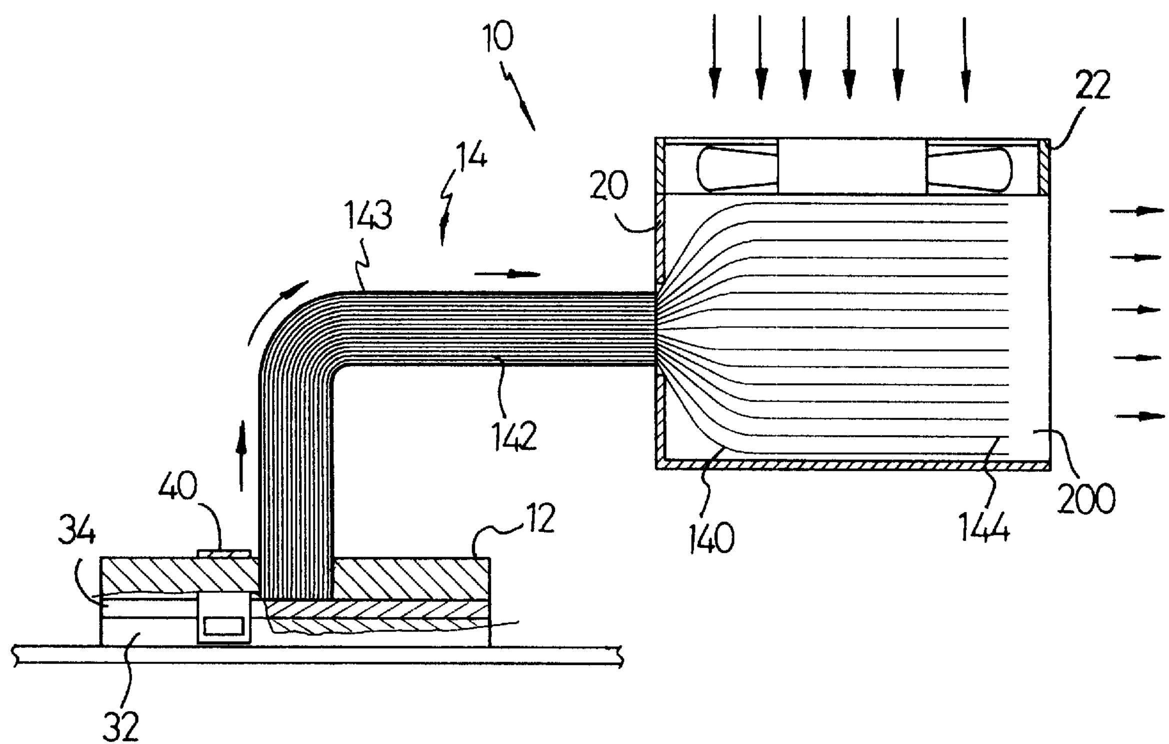
FIG. 2 is an operational plan view in partial cross section of the heat dissipating device in FIG. 1 with a computer CPU.

With reference to FIGS. 1 and 2, a heat dissipating device (10) in accordance with the present invention comprises a conductor holder (12) and a heat conductor (14). The conductor holder (12) is adapted to be attached to a CPU base (32). A through hole (120) is defined in the conductor holder (12). The heat conductor (14) is securely connected to the through hole (120) in the conductor holder (12) at a first end of the heat conductor (14). The heat conductor (14) comprises multiple heat-conductive elements (140). Each heat conductive element (140) is made of a material with good heat conductivity such as copper, carbon fiber and so on. Ends of the heat conductive elements (140) are twisted together to form a bound section (142) on the first end of the heat conductor (14). A heat-isolated coating (143) is mounted around the bound section (142) of the heat conductor (14) to keep the heat on the bound section (142) from being dissipated to the environment around the bound section (142). An expansion section (144) is formed on a second end of the heat conductor (14). The expansion section (144) of the heat conductor (14) is received in a dissipating housing (20). An opening (200) is defined in the dissipating housing (20), and a fan (22) is mounted on the dissipating housing (20).

Figure 3:
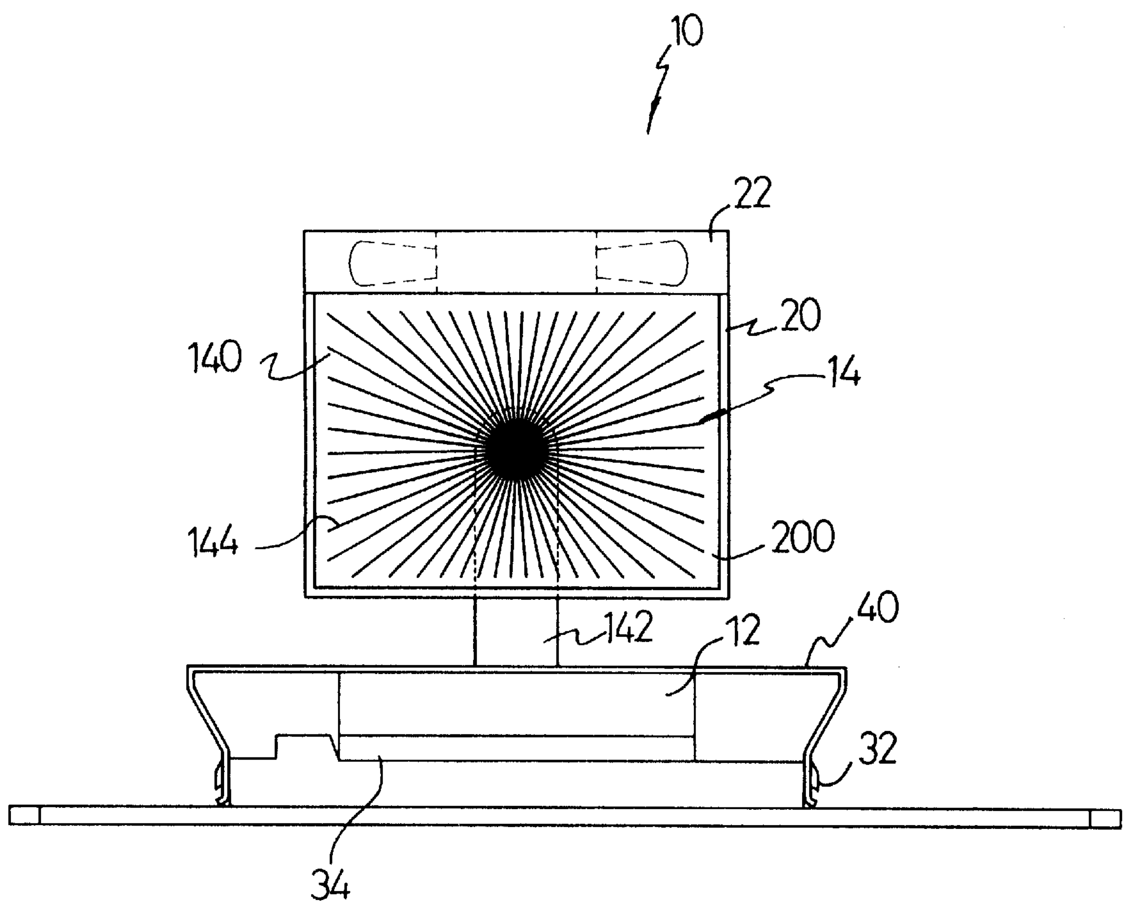
FIG. 3 is a side plan view of the heat dissipating device in FIG. 1 being mounted on the CPU in FIG. 2.

With reference to FIGS. 2 and 3, the conductor holder (12) is secured to the CPU base (32) in which the CPU (34) is mounted with a fastener (40). The end of the bound section (142) of the heat conductor (14) contacts with the CPU (34). With the connection of the heat conductor (14), the dissipating housing (20) can be secured in the casing of the computer and be far from the CPU (34). Accordingly, the heat generated by the CPU (34) can be conducted to the bound section of the conductor. The heat will then be conducted to the expansion section (144) of the heat conductor (14). The heat on the expansion section (144) of the heat conductor (14) can be dissipated from the opening (200) of the dissipating housing (20) by the air generated by the fan (22). Because each heat conductive element (140) on the expansion section (144) of the heat conductor (14) is far from each other, the surface of each heat conductive element (140) can be used to dissipate heat such that the area of the heat conductor (14) for dissipating heat is very large. The heat on the expansion section (144) of the heat conductor (14) can be rapidly and efficiently dissipated. Consequently, the heat generated by the CPU (34) will be dissipated quickly and the temperature of the CPU (34) is reduced. This can keep the CPU (34) in a good functional performance over long term use.

In practice, the expansion section (144) of the heat conductor (14) can be directly connected to and extend out from the casing of the computer without the dissipating housing (20). With a fan mounted on the casing of the computer, the heat on the expansion section (144) of the heat conductor (14) can be efficiently dissipated. With such a heat dissipating device (10), the structure of the heat dissipating device (10) is simplified, and the cost for manufacturing the heat dissipating device (10) is reduced.

Figure 4:
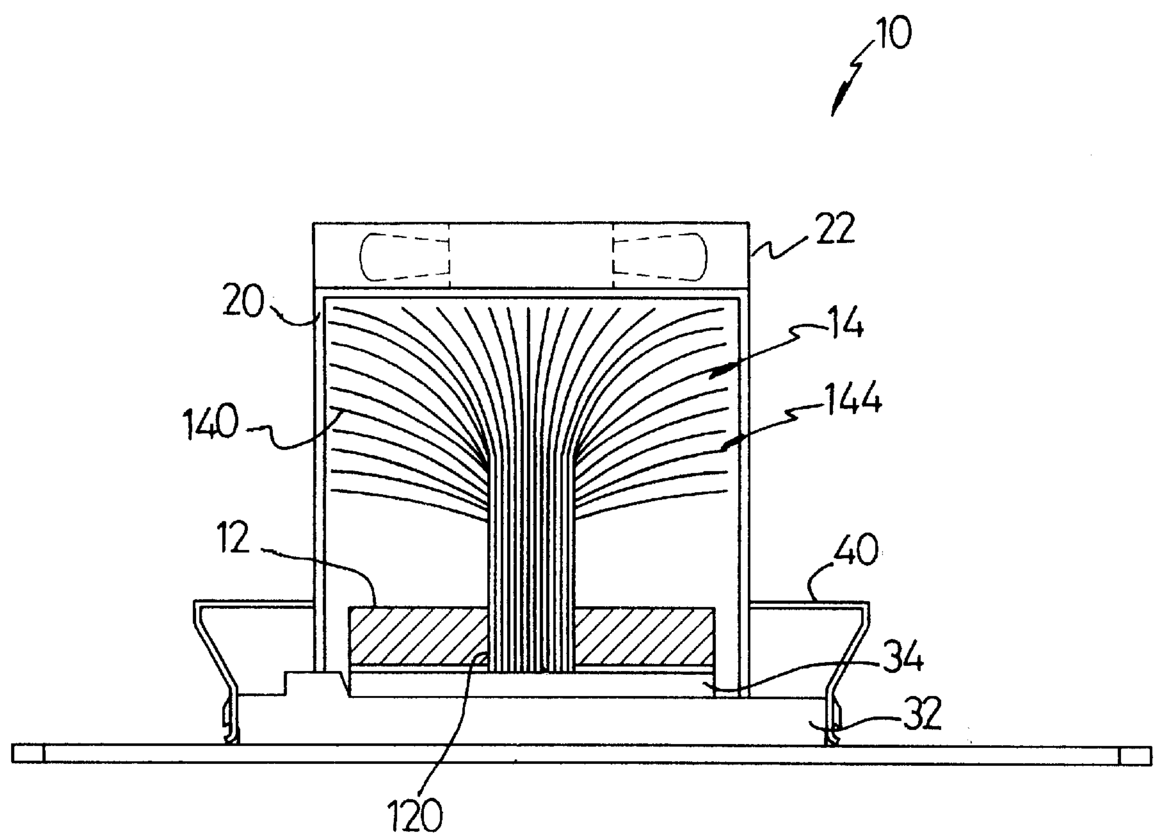
FIG. 4 is a side plan view of a second embodiment of a heat dissipating device in accordance with the present invention.

With reference to FIG. 4, the dissipating housing (20) is mounted on the CPU base (32) to cover the dissipating base (12) and the heat conductor (14). This also can efficiently dissipate the heat generated by the CPU (34) through the heat conductor (14).

Figure 5:
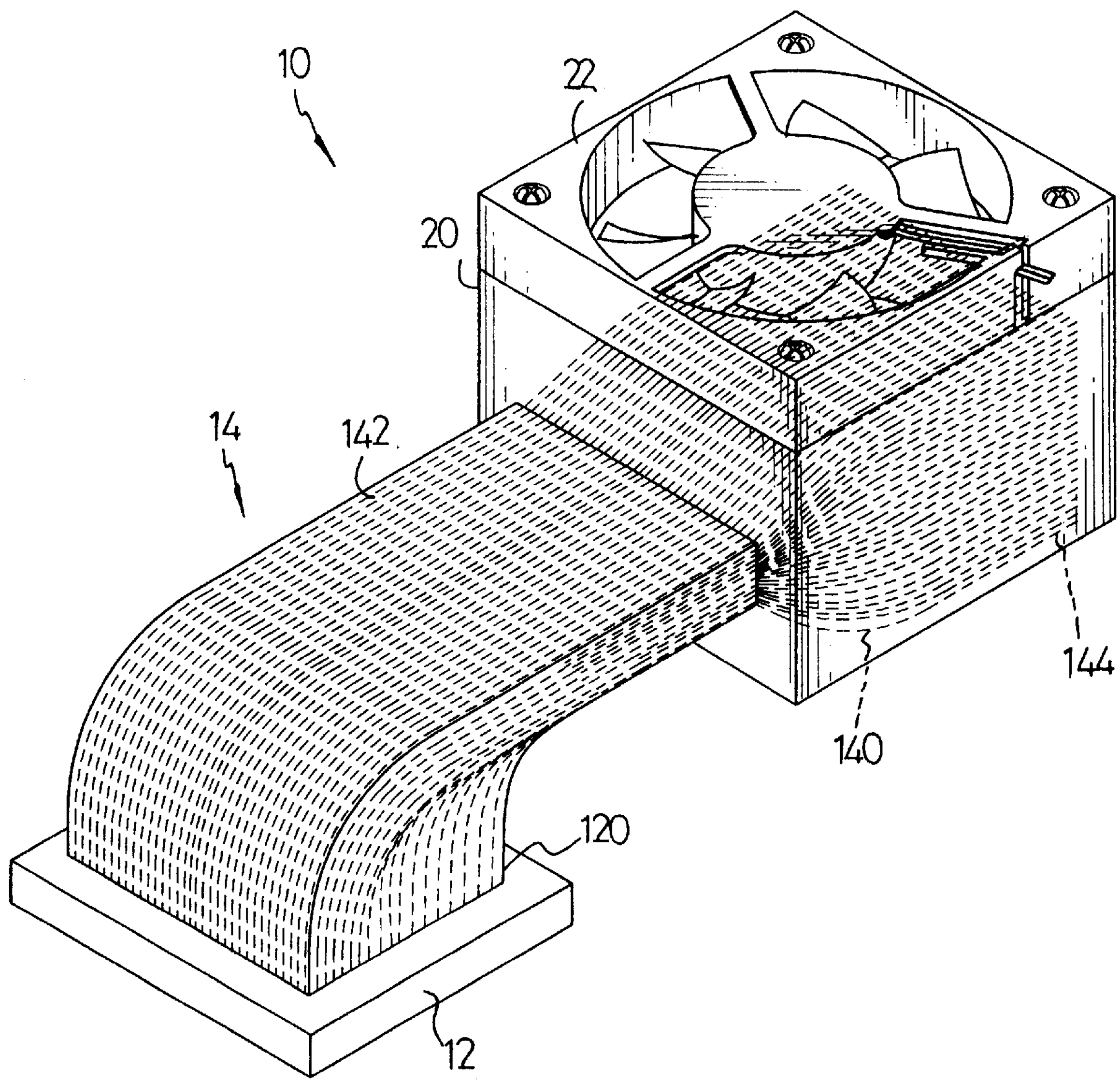
FIG. 5 is a perspective view of a third embodiment of a heat dissipating device in accordance with the present invention.
Figure 6:
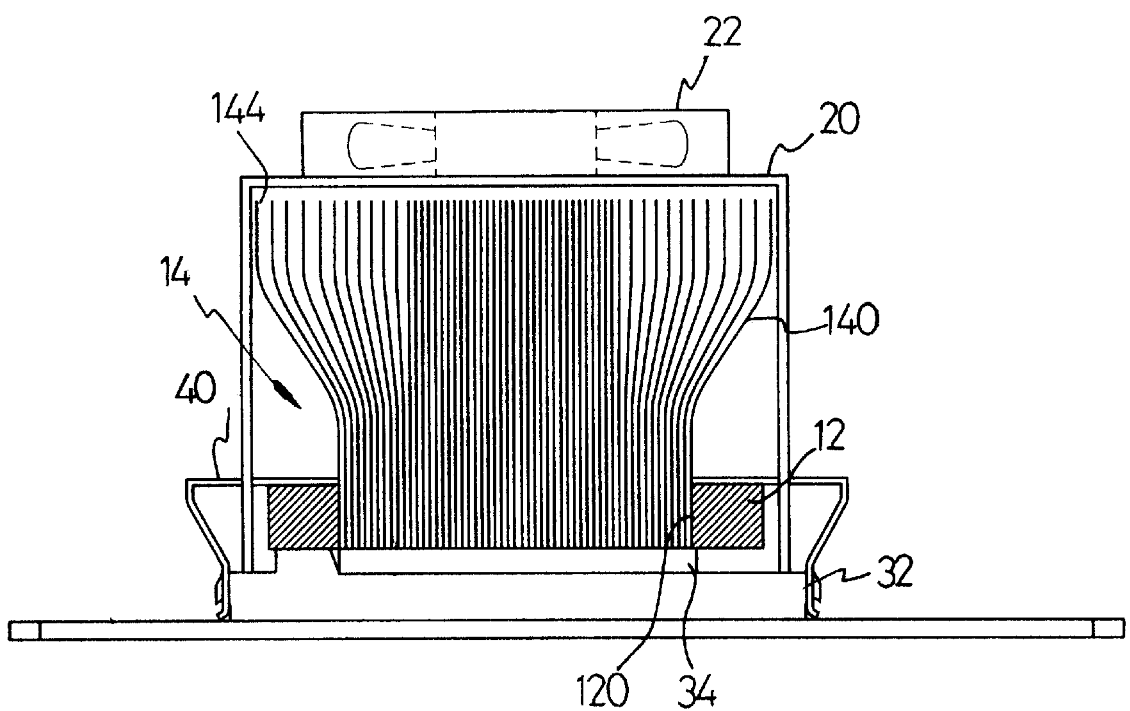
FIG. 6 is side plan view in partial cross section of a fourth embodiment of a heat dissipating device in accordance with the present invention.
Figure 7:
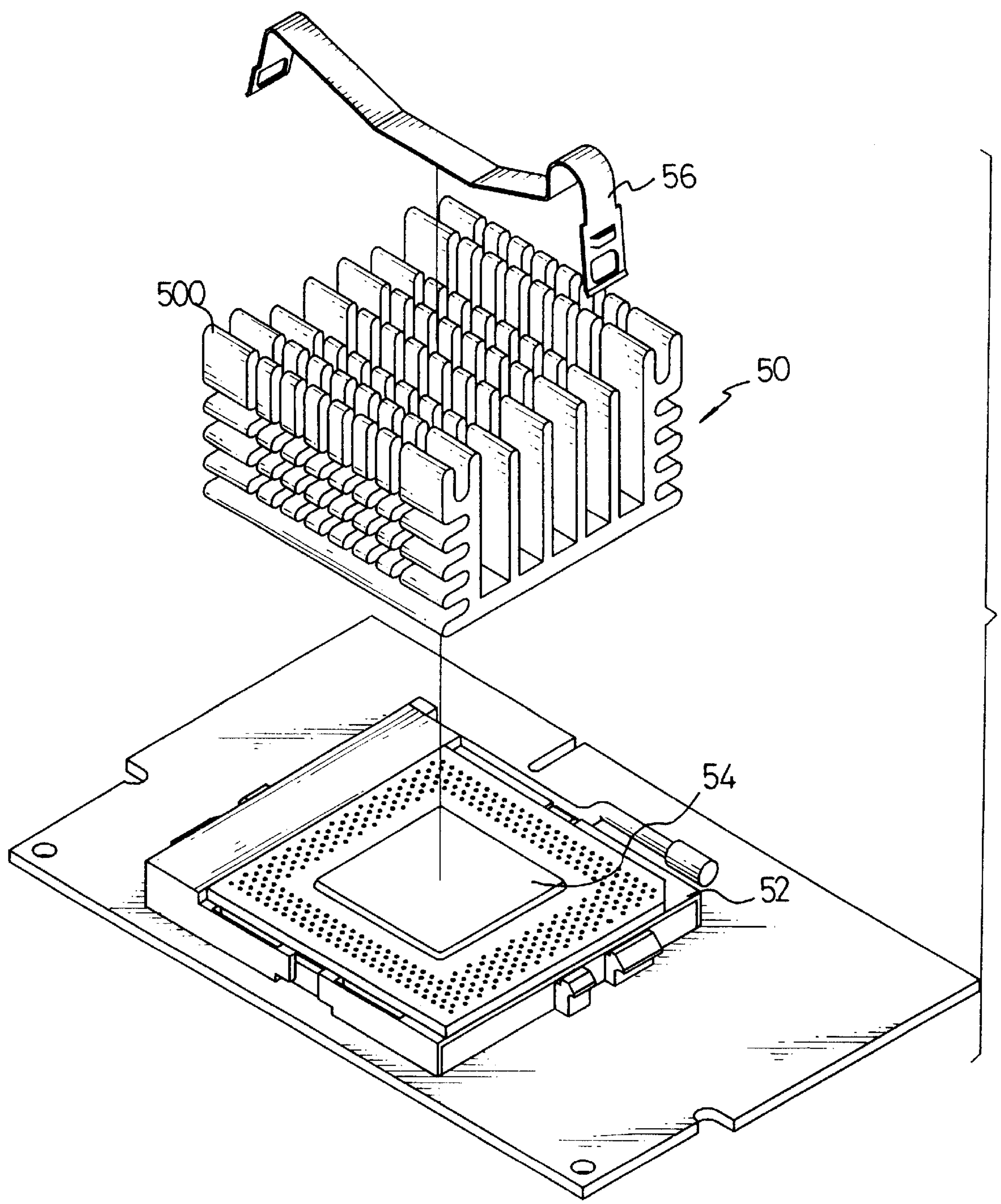
FIG. 7 is an exploded perspective view of a conventional heat dissipating device in accordance with the prior art with a computer CPU.
Figure 8:
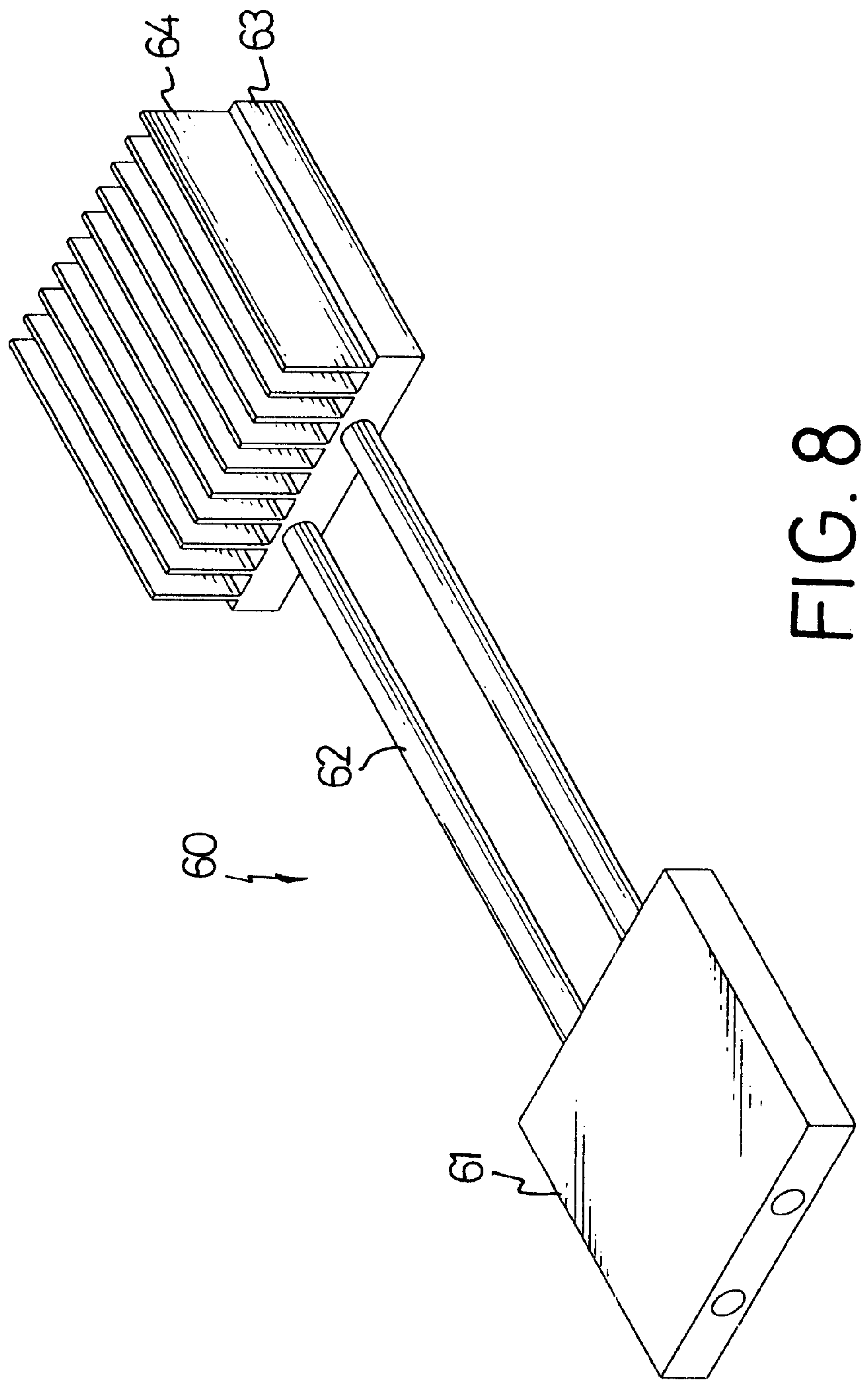
FIG. 8 is a perspective view of another conventional heat dissipating device in accordance with the prior art.

With reference to FIGS. 5 and 6, the through hole (120) in the holder (12) is designed to have a size same as that of the surface of the CPU (34) contacting with the heat conductor (14), and the heat conductor (14) has a cross section same as the contacting surface of the CPU (34) so as to completely contact with the CPU (34). This can improve the heat-dissipating efficient of the heat conductor (14).

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating device for a CPU comprising:

a conductor holder adapted for being securely attached to a CPU base in which the CPU is mounted and having a through hole defined in the conductor holder; and a heat conductor securely connected to the through hole in the conductor holder at a first end of the heat conductor and adapted to contact with the CPU, wherein the heat conductor comprises multiple heat conductive elements made of a material with good heat conductivity;

a first end of each of the heat conductive elements are combined together to form a bound section on the first end of the heat conductor; and a second end of each of the heat conductive elements is at a predetermined distance from the respective first end so as to form an expansion section on a second end of the heat conductor.

2. The heat dissipating device as claimed in claim 1 further comprising a dissipating housing connected to the heat conductor for receiving the expansion section of the heat conductor and having an opening; and a fan securely attached to the dissipating housing.

3. The heat dissipating device as claimed in claim 2 further comprising a coating mounted around the bound section of the heat conductor.

4. The heat dissipating device as claimed in claim 3, wherein the through hole in the conductor holder has a size adapted to be the same as a size of a surface of the CPU contacting with the heat conductor; and the heat conductor has a cross section adapted to be the same as the contacting surface of the CPU so as to completely contact with the CPU.

5. The heat dissipating device as claimed in claim 1 further comprising a dissipating housing adapted to be securely attached to the CPU base for receiving the conductor holder and the heat conductor and having an opening; and a fan securely attached to the dissipating housing.

6. The heat dissipating device as claimed in claim 1, wherein the through hole in the conductor holder has a size adapted to be same to a size of a surface of the CPU contacting with the heat conductor; and the heat conductor has a cross section adapted to be same to the contacting surface of the CPU so as to completely contact with the CPU.

7. The heat dissipating device as claimed in claim 1, wherein each heat conductive element is made of copper.

8. The heat dissipating device as claimed in claim 1, wherein each heat conductive element is made of carbon fiber.

* * * * *